United States Patent
Kim et al.

(10) Patent No.: US 10,897,066 B2
(45) Date of Patent: Jan. 19, 2021

(54) BATTERY CELL CAPABLE OF MEASURING INNER TEMPERATURE THEREOF

(71) Applicant: LG Chem, Ltd., Seoul (KR)

(72) Inventors: Su-Hyun Kim, Daejeon (KR); Su-Rim Lee, Daejeon (KR); Song-Taek Oh, Daejeon (KR)

(73) Assignee: LG Chem, Ltd.

( * ) Notice: Subject to any disclaimer, the term of this patent is extended or adjusted under 35 U.S.C. 154(b) by 0 days.

(21) Appl. No.: 16/093,391

(22) PCT Filed: Dec. 7, 2017

(86) PCT No.: PCT/KR2017/014296
§ 371 (c)(1),
(2) Date: Oct. 12, 2018

(87) PCT Pub. No.: WO2018/128283
PCT Pub. Date: Jul. 12, 2018

(65) Prior Publication Data
US 2019/0190092 A1   Jun. 20, 2019

(30) Foreign Application Priority Data

Jan. 3, 2017   (KR) .................. KR10-2017-0000678

(51) Int. Cl.
*H01M 10/48* (2006.01)
*H01M 2/26* (2006.01)
(Continued)

(52) U.S. Cl.
CPC ........... *H01M 10/486* (2013.01); *H01M 2/26* (2013.01); *H01M 2/263* (2013.01); *H01M 2/30* (2013.01);
(Continued)

(58) Field of Classification Search
CPC ....... H01M 10/48; H01M 2/30; H01M 10/058
See application file for complete search history.

(56) References Cited

U.S. PATENT DOCUMENTS

| 2009/0154048 A1 | 6/2009 | Jang et al. |
| 2012/0009450 A1 | 1/2012 | Chun |

(Continued)

FOREIGN PATENT DOCUMENTS

| CN | 105283999 A | 1/2016 |
| JP | 2548765 Y2 | 9/1997 |

(Continued)

OTHER PUBLICATIONS

Extended European Search Report including Written Opinion for Application No. EP17889679.1, dated Jun. 24, 2019, pp. 1-9.

(Continued)

*Primary Examiner* — Osei K Amponsah
(74) *Attorney, Agent, or Firm* — Lerner, David, Littenberg, Krumholz & Mentlik, LLP

(57) ABSTRACT

Disclosed is a battery cell having an electrode assembly configured as a structure in which a cathode, an anode, and a separator interposed between the cathode and the anode, wherein a surface or both surfaces of respective electrode current collectors of the cathode and the anode are coated with an electrode mixture including an electrode active material, the cathode and the anode are provided with a first cathode terminal and a first anode terminal respectively serving as external input/output terminals of the battery cell, and at least one of the cathode and the anode is provided with a resistance measurement terminal at a position opposite to the external input/output terminal, for measuring a resistance of an electrode current collector.

14 Claims, 6 Drawing Sheets

(51) Int. Cl.

| | | |
|---|---|---|
| *H01M 2/30* | (2006.01) | |
| *H01M 4/66* | (2006.01) | |
| *H01M 10/0583* | (2010.01) | |
| *H01M 10/42* | (2006.01) | |
| *H01M 10/0585* | (2010.01) | |
| *H01M 10/04* | (2006.01) | |
| *H01M 10/0587* | (2010.01) | |
| *G01R 31/374* | (2019.01) | |
| *G01R 31/389* | (2019.01) | |

(52) U.S. Cl.
CPC ......... *H01M 4/661* (2013.01); *H01M 10/045* (2013.01); *H01M 10/0431* (2013.01); *H01M 10/0583* (2013.01); *H01M 10/0585* (2013.01); *H01M 10/0587* (2013.01); *H01M 10/4285* (2013.01); *H01M 10/48* (2013.01); *G01R 31/374* (2019.01); *G01R 31/389* (2019.01); *H01M 2200/00* (2013.01)

(56) References Cited

U.S. PATENT DOCUMENTS

| | | | | |
|---|---|---|---|---|
| 2013/0004811 A1* | 1/2013 | Banerjee | ............. | H01M 10/637 429/62 |
| 2013/0156072 A1* | 6/2013 | Hebiguchi | ............... | G01K 7/42 374/183 |
| 2013/0196215 A1 | 8/2013 | Karatsu et al. | | |
| 2014/0370338 A1 | 12/2014 | Lim | | |
| 2016/0141721 A1 | 5/2016 | Mimura | | |
| 2018/0053974 A1 | 2/2018 | Lee et al. | | |

FOREIGN PATENT DOCUMENTS

| | | |
|---|---|---|
| JP | 2004111186 A | 4/2004 |
| JP | 2008117626 A | 5/2008 |
| JP | 2009146879 A | 7/2009 |
| JP | 2010086875 A | 4/2010 |
| JP | 2012174418 A | 9/2012 |
| JP | 2013157287 A | 8/2013 |
| JP | 2016031829 A | 3/2016 |
| KR | 20100006491 U | 6/2010 |
| KR | 20110136777 A | 12/2011 |
| KR | 101147237 B1 | 5/2012 |
| KR | 20120136823 A | 12/2012 |
| KR | 20130089376 A | 8/2013 |
| KR | 20140028135 A | 3/2014 |
| KR | 101392213 B1 | 5/2014 |
| KR | 20140131716 A | 11/2014 |
| WO | 2016167602 A1 | 10/2016 |

OTHER PUBLICATIONS

Search report from International Application No. PCT/KR2017/014296, dated Mar. 28, 2018.

* cited by examiner

[Fig. 1]
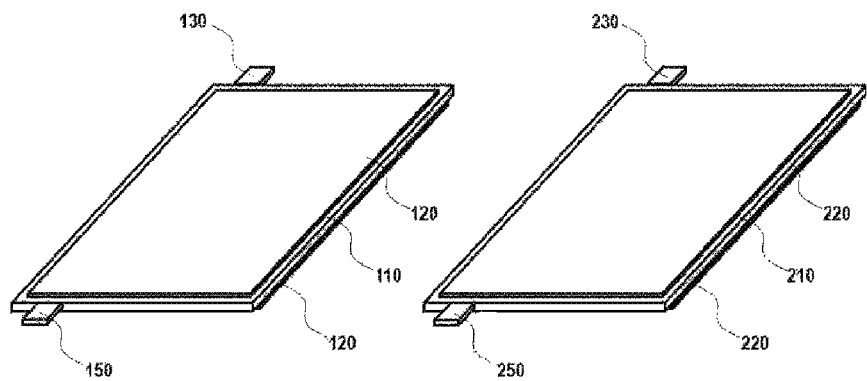
[Fig. 2]
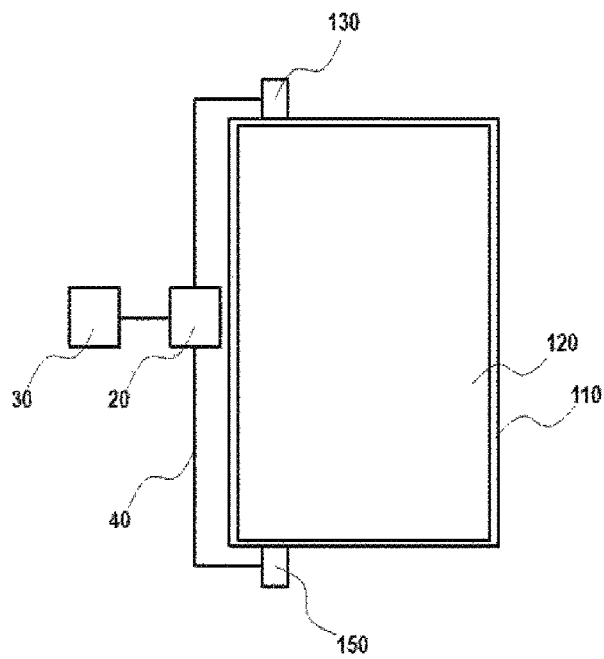

[Fig. 3]
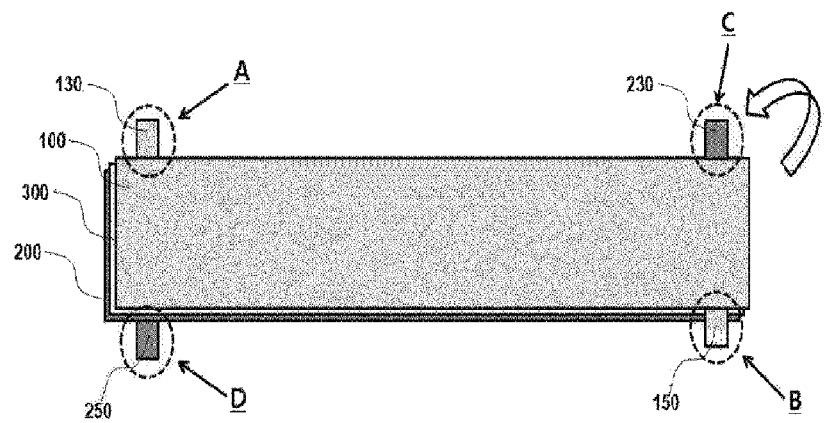
[Fig. 4]
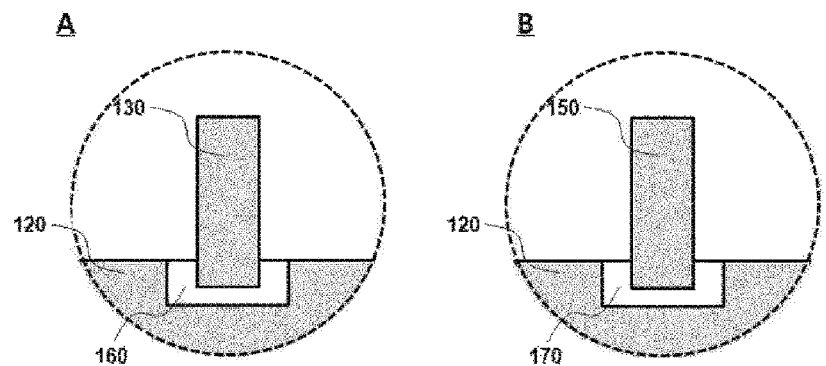
[Fig. 5]
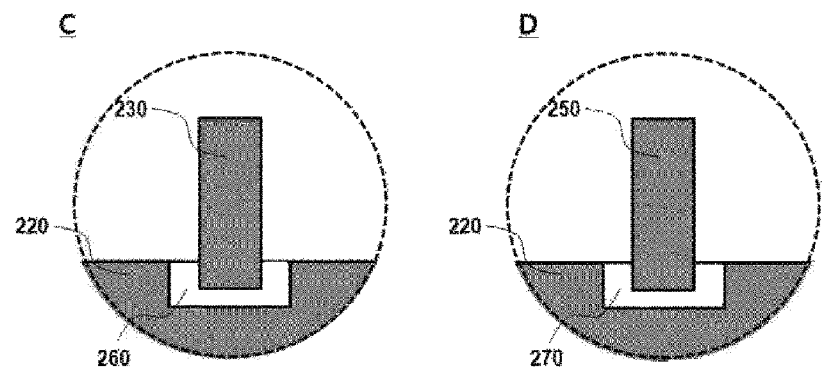

[Fig. 6]
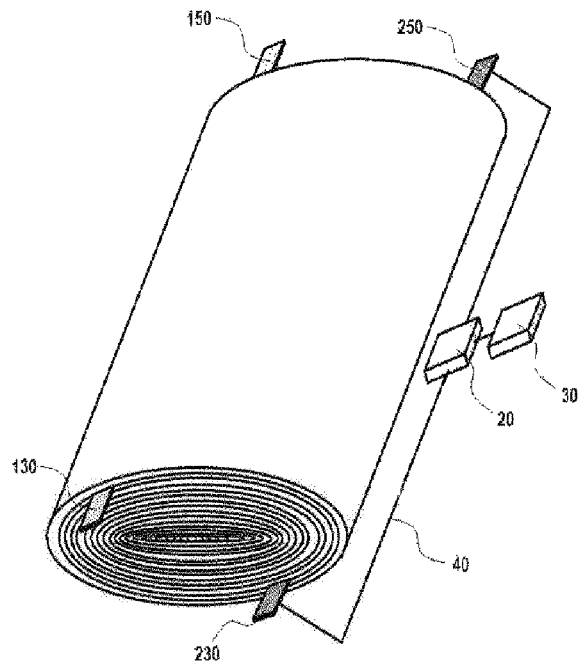
[Fig. 7]
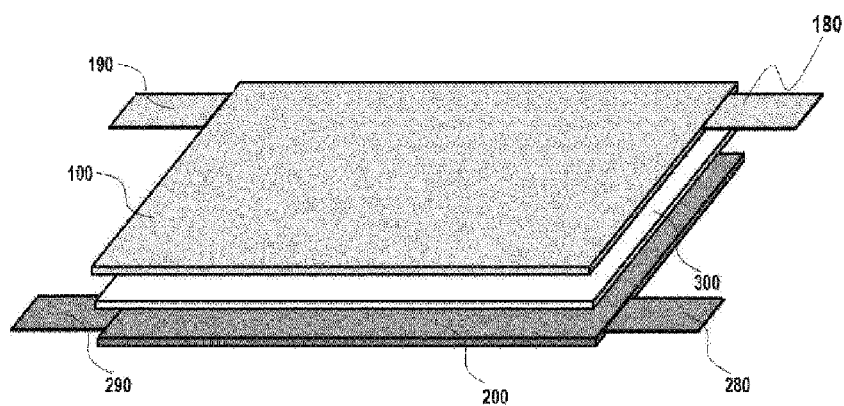

[Fig. 8]
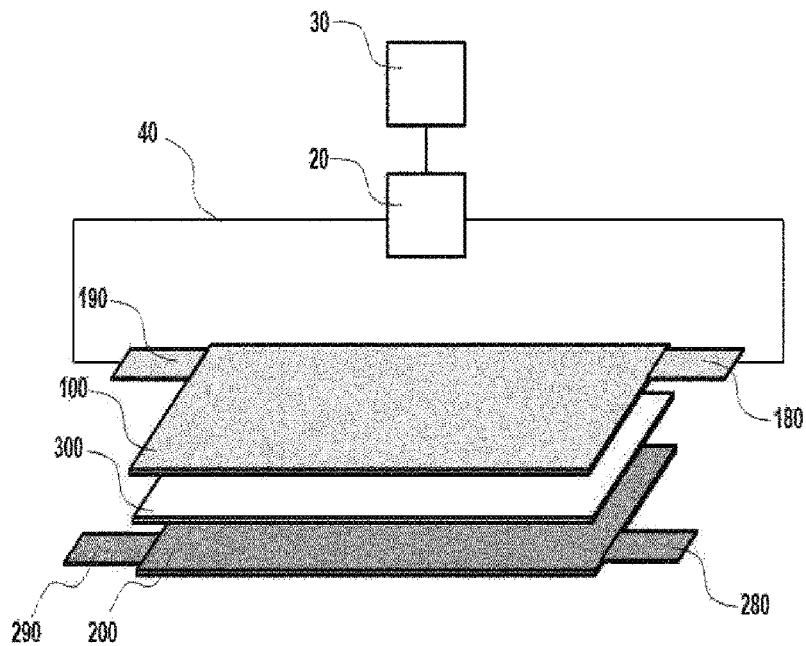
[Fig. 9]
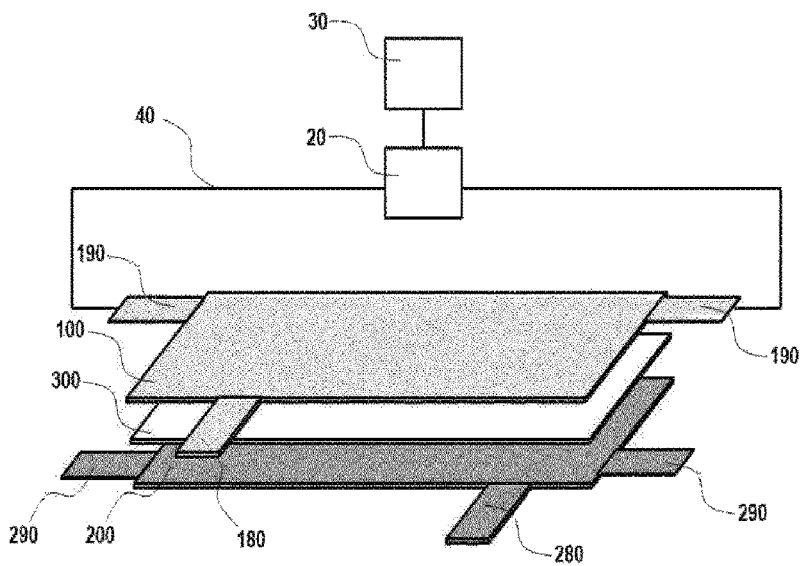

[Fig. 10]
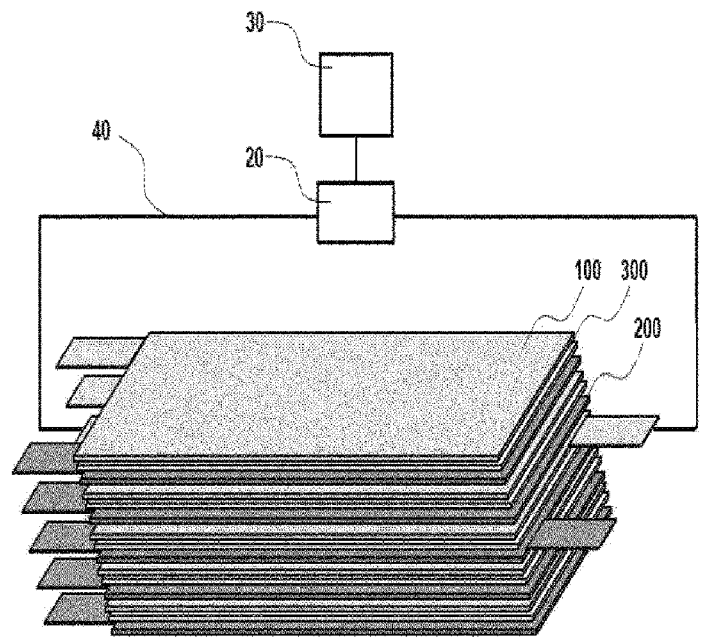
[Fig. 11]
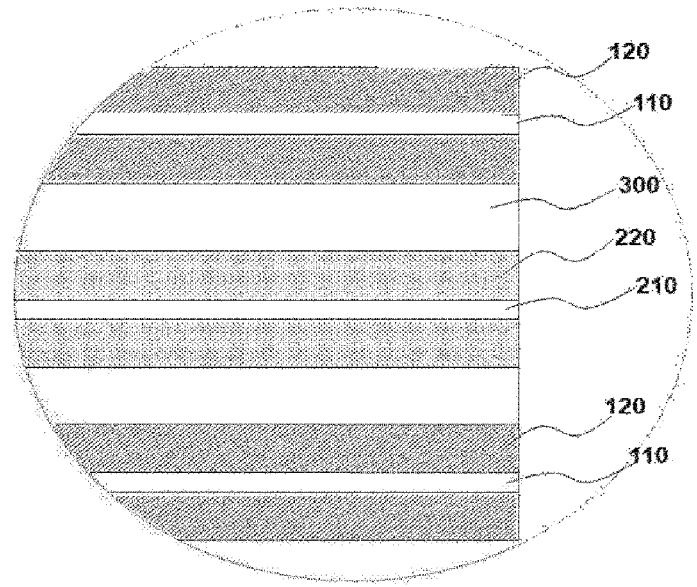

[Fig. 12]
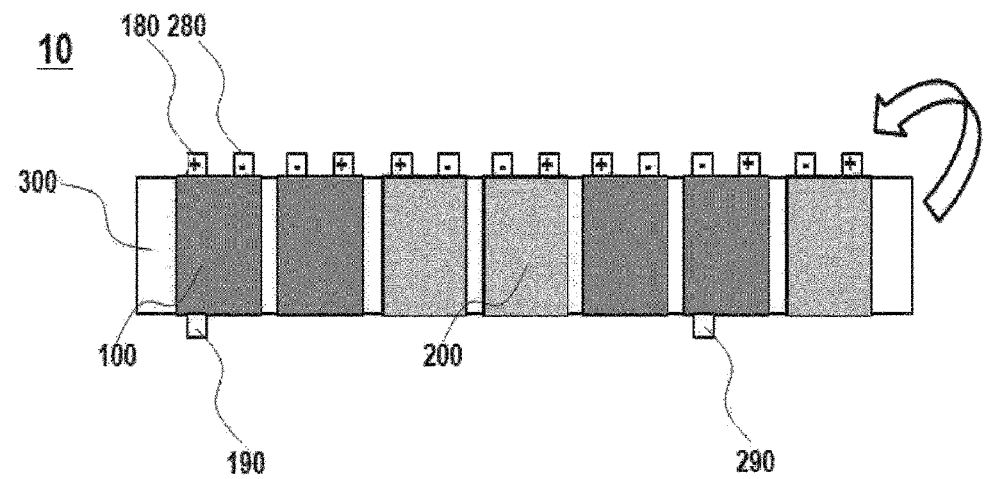
[Fig. 13]
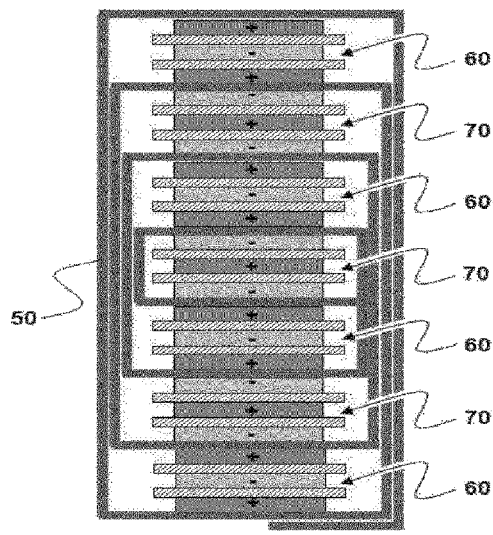

BATTERY CELL CAPABLE OF MEASURING INNER TEMPERATURE THEREOF

CROSS-REFERENCE TO RELATED APPLICATIONS

The present application is a national phase entry under 35 U.S.C. § 371 of International Application No. PCT/KR2017/014296, filed Dec. 7, 2017, which claims priority from Korean Application No. 10-2017-0000678, filed Jan. 3, 2017, all of which are incorporated herein by reference.

TECHNICAL FIELD

The present invention generally relates to a battery cell capable of measuring an inner temperature thereof.

BACKGROUND ART

Increase of energy price due to expected depletion of fossil fuels and great concern about environmental pollution makes environmentally-friendly alternative energy sources as indispensable in future life. R&D for various power generation techniques, such as nuclear energy, solar energy, wind energy, tidal power, and the like, is being conducted. Also, power storage devices for more efficient use of the generated energy are also drawing much attention.

In particular, demand for secondary batteries as an energy source has been rapidly increased as technology and demand with respect to mobile devices have been developed. As a result, a significant amount of research into batteries that can meet various demands has been conducted.

Generally, a secondary battery refers to a rechargeable battery, while a general battery refers to a non-rechargeable battery. Secondary batteries are widely used for electronic devices such as cellular phones, laptop computers, video cameras, electric vehicles, or the like. Comparing based on the same volume, lithium secondary battery has triple capacity of nickel-cadmium batteries or nickel hydrogen batteries. Its high energy density per unit weight, lithium secondary batteries are more and more widely used.

Secondary batteries may be classified as lithium ion batteries using liquid electrolytes and lithium ion polymer batteries using polymer solid electrolytes, depending on the types of electrolytes used therein. In addition, depending on the shape of a battery case, secondary batteries may be classified as a cylindrical battery having an electrode assembly mounted in a cylindrical metal container, a prismatic battery having an electrode assembly mounted in a prismatic metal container, or a pouch-shaped battery having an electrode assembly mounted in a pouch-shaped case formed of an aluminum laminate sheet.

Moreover, secondary batteries may be classified based on the structure of an electrode assembly having a structure in which a cathode and an anode are stacked in the state in which a separator is interposed between the cathode and the anode. For example, the electrode assembly may be configured to be a jelly-roll (wound) type electrode assembly in which long sheet type cathodes and long sheet type anodes are wound in the state in which a separator is disposed between the cathode and the anode or a stack-type structure in which pluralities of cathodes and anodes each having a predetermined size are sequentially stacked in the state in which separators are disposed respectively between the cathodes and the anodes. In recent years, in order to solve problems caused by the jelly-roll type electrode assembly and the stack-type electrode assembly, there has been developed a stack/folding-type electrode assembly, which is a combination of the jelly-roll type electrode assembly and the stack-type electrode assembly, having an improved structure in which predetermined numbers of cathodes and anodes are sequentially stacked in the state in which separators are disposed respectively between the cathodes and the anodes to constitute a unit cell, and then a plurality of unit cells is sequentially folded while being placed on a separation film.

The jelly-roll type electrode assembly has advantages in that the jelly roll type electrode assembly is easy to manufacture and has high energy density per unit mass. The jelly-roll type electrode assembly is easy to be mounted into a cylindrical secondary battery case, thereby widely used.

However, conventional lithium secondary batteries may explode due to high temperature and high pressure therein resulting from abnormal operation states thereof such as an internal short, overcharging exceeding allowable current and voltage, exposure to high temperature, and a shock due to dropping. That is, when secondary batteries are overheated due to an abnormal operation, gas is generated inside such that the secondary batteries may explode due to high pressure. Also, when the temperature of the secondary batteries drastically increases due to a short circuit current, gas ignites, causing explosion accompanied by a fire accident.

Therefore, to prevent secondary batteries from overheating, a protection device that measures a temperature of the secondary batteries and stops charging and discharging of the secondary batteries immediately when temperature excessively increases, has been widely used.

Such a conventional secondary battery protection device measures a surface temperature of a secondary battery and monitors the measurements. However, when a temperature change of a secondary battery is monitored in such way, follow-up measures can be taken but precautionary measures are virtually impossible. That is, when a short circuit current is caused by a short circuit occurring in the secondary battery due to penetration of a needle-shaped object or the like, a radical electrochemical reaction occurs between a cathode plate and an anode plate, so heat is generated. The generated heat passes to a surrounding material, and by this heat transfer, a surface temperature of the secondary battery rises at a high speed. Thus, an instance at which the secondary battery protection device detects overheating of the surface of the secondary battery comes after considerable amount of time when problem with safety of the secondary battery has occurred due to a flow of short circuit current.

To solve such problems, a technique for measuring a temperature inside a battery in real time has been developed. For example, in a related art (KR 2014-0131716 A), a temperature of the battery is measured by a temperature sensor such as a resistance thermometer detector (RTD), a thermocoupler, and a thermistor attached to a cell surface, but an additional process is needed to attach such sensor component during manufacture. The additional process causes not only complex manufacturing process, increased cost, decreased battery capacity, but also arise problems such as frequent malfunctions of a sensor component during operation, errors of measured temperature, constraint of being applied to limited type of secondary batteries excluding a jelly-roll type secondary battery, a stack-type secondary battery, and a stack/folding-type secondary battery, and so on.

In detail, a swelling phenomenon of an electrode may occur when using a battery in the long term. In this case, a temperature measuring sensor such as a thermocoupler pressurizes the electrode partially so that the electrode may be deformed. Such pressurization and deformation cause flaking of active materials or fracture of a separation film in an electrode, and when measuring temperature with a thermocoupler or a thermistor, there is a point where it is impossible to measure a temperature precisely due to a response speed (25 ms) of the temperature measuring sensor.

In addition, when the temperature measuring sensor is corroded due to an electrolyte in a battery, metal ions generating low voltage may be generated.

Accordingly, there is a high necessity for a battery cell capable of measuring an inner temperature thereof, which is easy to be manufactured with low cost, prevents battery capacity from being decreased, also is capable of being applied to various secondary batteries.

SUMMARY OF INVENTION

Technical Problem

Accordingly, the present invention has been made to solve the above problems and other technical problems that have yet to be resolved.

As a result of a variety of extensive and intensive studies and experiments to solve the problems described above, the inventors of the present invention confirmed that, as described below, when a cathode and an anode are coated with an electrode mixture including an electrode active material, and the cathode and the anode are provided with respective electrode terminals serving as external input/output terminals, and a resistance measurement terminal is provided at a position opposite to the external input/output terminal, desired effects may be obtained, thus completing the present invention.

Solution to Problem

To achieve the above objective, according to one aspect of the present invention, there is provided a battery cell according to the present invention including an electrode assembly configured to have a cathode, an anode, and a separator interposed between the cathode and the anode, wherein an electrode mixture including an electrode active material is applied to one surface or both surfaces of each electrode current collector of the cathode and the anode, the cathode and the anode are provided with a first cathode terminal and a first anode terminal respectively serving as external input/output terminals, and at least one of the cathode and the anode is provided with a resistance measurement terminal at a position opposite to the external input/output terminal to measure a resistance of the electrode current collector.

As described above in the description of related art, a surface temperature of the battery is measured or a separate sensor component cell is inserted into the battery to measure an inner temperature of the battery cell.

However, in the present invention, at least one of the cathode and the anode is provided with the resistance measurement terminal and the resistance measurement terminal measures a resistance change in real time. Since a resistance curve for a specific metal according to temperature is known, an inner temperature of the battery cell is measured in real time by measuring a resistance change in the cathode or the anode during operation of a secondary battery including the battery cell.

Therefore, a proactive protection device may operate to prepare for an explode and ignition by measuring the temperature of the battery cell in real time. The temperature of the battery cell may be measured more accurately by directly measuring the temperature of the electrode current collector, which is sensitive to the temperature change. The ease of manufacturing may be ensured by connecting the terminals on the cathode or the anode without the necessity of attaching a separate sensor member and manufacturing cost may be reduced by replacing expensive sensors. Since the resistance measurement terminal is manufactured and attached in the manufacturing steps of the cathode and the anode, the battery cell of the present invention is easily applied to manufactures of the jelly-roll type, stack-type, and stack/folding-type electrode assemblies.

The battery cell may further include a resistance measurement member measuring the resistance of the electrode current collector by electrically connecting one external input/output terminal, which is selected from the first cathode terminal and the first anode terminal, and the resistance measurement terminal having same polarity with the selected external input/output terminal each other, and a controller estimating a temperature of the battery cell based on a resistance value of the electrode current collector measured by the resistance measurement member.

Types of the external input/output terminal and the resistance measurement terminal having the same polarity with each other are not particularly limited, but may be electrically connected to each other by a connection member made of copper, aluminum, or an alloy thereof in one specific example. The control unit may estimate a temperature of the electrode current collector by a measured resistance value thereof based on the temperature correlation according to a resistance of the metal consisting the electrode current collector.

The resistance measurement electrode terminal may be provided in the cathode or the anode. The electrode assembly may be configured as a structure in which a cathode sheet and an anode sheet are wound with the separator interposed therebetween, one end of the cathode sheet is provided with a first uncoated cathode portion that is not coated with the electrode mixture and one end of the anode sheet is provided with a first uncoated anode portion that is not coated with the electrode mixture, and the first cathode terminal is coupled to the electrode current collector of the first uncoated cathode portion and the first anode terminal is coupled to the electrode current collector of the first uncoated anode portion.

That is, the battery cell according to the present invention may include a jelly-roll type electrode assembly in which the cathode and the anode which are long sheet types are wound with the separator. Each of the cathode sheet and the anode sheet may be provided with the uncoated portion that is not coated with the electrode mixture and the electrode terminal may be coupled thereto.

The cathode sheet may be provided at an end thereof opposite to the first uncoated cathode portion with a second uncoated cathode portion that is not coated with the electrode mixture and a resistance measurement cathode terminal may be coupled to the electrode current collector of the second uncoated cathode portion.

In addition, the anode sheet may be provided at an end thereof opposite to the first uncoated anode portion with a second uncoated anode portion that is not coated with the electrode mixture and the resistance measurement anode terminal may be coupled to the electrode current collector of the second uncoated anode portion.

A position of the resistance measurement electrode terminal is not particularly limited when the position is in an uncoated portion that is not coated with the electrode mixture. However, since the resistance is measured at the shortest distance, it is preferable that the resistance measurement electrode terminal is provided on the second uncoated cathode portion provided at the position opposite to the first uncoated cathode portion or provided on the second uncoated anode portion provided at the position opposite the first uncoated anode portion, in order to widen the range of the measured temperature. In other words, it is preferable that the resistance measurement electrode terminal is provided at ends of the electrodes. However, when only the temperature of a specific part is to be measured, it is necessity for the position of the electrode terminal to be included in the range where the resistance is measured.

Meanwhile, the electrode assembly included in the battery cell may be configured as a structure in which a plurality of cathode plates and a plurality of anode plates are stacked with the separators interposed therebetween. In addition, a cathode tab that is not coated with the electrode mixture may protrude from each one end of the cathode plates and an anode tab that is not coated with the electrode mixture may protrude from each one end of the anode plates. Furthermore, the cathode tab may be coupled to a cathode lead to form the first cathode terminal and the anode tab may be coupled to an anode lead to form the first anode terminal.

That is, the battery cell according to the present invention may include a stack-type electrode assembly in which the cathodes and the anodes, which are cut in specific sizes of units, are stacked with the separators in order. Each one end of the electrode plates may be provided with the protruding electrode tab and each electrode tabs may be coupled to the electrode lead to form the electrode terminal.

One of the plurality of cathode plates may be provided with a resistance measurement cathode tab protruding from a position opposite to the cathode tabs. One of the plurality of anode plates may be provided with a resistance measurement anode tab protruding from a position opposite to the anode tabs.

Meanwhile, the electrode assembly may be configured as a structure in which a plurality of unit cells having a structure in which at least one cathode plate and at least one anode plate are stacked with the separator interposed therebetween are wound with a separation film. In addition, a cathode tab that is not coated with the electrode mixture may protrude from each one end of the cathode plate of the unit cells and an anode tab that is not coated with the electrode mixture may protrude from each one end of the anode plate of the unit cells. Furthermore, each cathode tab of the wound unit cells may be coupled to a cathode lead to form the first cathode terminal and each anode tab may be coupled to an anode lead to form the first anode terminal.

That is, the battery cell according to the present invention may include a stack/folding-type electrode assembly which is combined structure of the jelly-roll type and the stack-type electrode assemblies. The stack/folding-type electrode assembly is configured as a structure in which the plurality of the unit cells, having the structure in which specific units of the cathodes and the anodes are stacked with the separator interposed therebetween, are provided on the separation film and wounded. The tabs may protrude from each one end of the plates and each tab may be coupled to the electrode lead to form the electrode terminal.

One of the cathode plates of the wound unit cells may be provided with a resistance measurement cathode tab protruding from a position opposite to the cathode tabs. One of the anode plates of the wound unit cells may be provided with a resistance measurement anode tab protruding from a position opposite to the anode tabs.

Meanwhile, the battery cell according to the present invention may be provided with an additional resistance measurement terminal, which is provided in an electrode surface perpendicularly neighboring to the resistance measurement terminal. The resistance measurement terminals may be electrically connected to each other by a connection member to measure the resistance of the electrode current collector, so the temperature of the battery cell corresponding to the measured resistance value may be estimated. Therefore, by forming the additional resistance measurement terminal on the electrode, the resistance of the battery cell is capable of being measured without using the existing electrode terminal, so that it is possible to flexibly cope with manufactures of various types of battery cell.

The battery cell according to the present invention may include one cathode tab, one anode tab, a pair of resistance measurement cathode tabs, and a pair of resistance measurement anode tabs. The pair of resistance measurement cathode tabs, and the pair of resistance measurement anode tabs may be electrically connected to each other by a connection member, a resistance measurement member may be connected to the connection member to measure the resistance of the electrode current collector, and a controller may estimate the temperature of the battery cell.

The present invention provides a battery pack including the battery cell and the controller may further include a function electrically disconnecting the external input/output terminal of the battery cell when a measured temperature is equal to or greater than a critical value.

Therefore, the battery pack according to the present invention precisely predicts a resistance change of the battery cell in real time. Although the temperature of the battery increases above the critical value predetermined in the controller, the function of the controller automatically disconnects the electrical connection, thereby preventing an explode and ignition, and improving safety.

For reference, the battery cell included in the battery pack may be a lithium secondary battery as an embodiment, but the present invention is not limited thereto.

Such a lithium secondary battery includes a cathode, an anode, a separator, and a non-aqueous electrolytic solution containing lithium salt, and a structure of the lithium secondary battery is well known in the art, therefore a detailed description thereof will be omitted.

The present invention provides a device including the battery pack as a power source. The device may be selected from among a mobile phone, a portable computer, a smartphone, a smartpad, a netbook computer, a wearable electronic device, a light electric vehicle (LEV), an electric vehicle, a hybrid electric vehicle, a plug-in hybrid electric vehicle, and a power storage device. The structure of the battery pack, the device, and a method of manufacturing the device are well known in the art to which the present invention pertains, and therefore, a detailed description thereof will be omitted.

BRIEF DESCRIPTION OF DRAWINGS

FIG. 1 is a perspective view showing a cathode and an anode according to the present invention;

FIG. 2 is a plan view showing a resistance measurement member and a controller coupled each other in a cathode according to the present invention;

FIG. 3 is a perspective view showing a cathode, a separator, an anode are stacked in order and an electrode terminal and an electrode resistance measurement terminal are coupled to the cathode and the anode, according to the present invention;

FIG. 4 is an enlarged view showing a connection between a cathode terminal, a resistance measurement cathode terminal, and a cathode plate;

FIG. 5 is an enlarged view showing a connection between an anode terminal, a resistance measurement anode terminal, and an anode plate;

FIG. 6 is a perspective view showing a structure in which a cathode sheet and an anode sheet are wound with a separator interposed therebetween according to the present invention;

FIG. 7 is a perspective view showing a structure in which a cathode plate and an anode plate are stacked with a separator interposed therebetween;

FIG. 8 is a perspective view showing a structure in which a cathode plate and an anode plate are stacked with a separator interposed therebetween and a resistance measurement member and a controller are connected;

FIG. 9 is a perspective view showing that a resistance between resistance measurement cathode tabs is measured by an additional resistance measurement cathode tab;

FIG. 10 is a perspective view showing a structure in which a plurality of cathode plates and a plurality of anode plates are stacked with a separator interposed between the cathode plate and the anode plate and a resistance measurement member and a controller are connected to each other;

FIG. 11 is an enlarged cross-sectional view showing a part of FIG. 9;

FIG. 12 is a plan view showing that at least one cathode plate and at least one anode plate are arranged with a separator interposed between the cathode plate and the anode plate; and FIG. 13 is a front view showing a structure configured with a plurality of unit cells having a structure in which at least one cathode plate and at least one anode plate are stacked with a separator interposed therebetween are wound with a separation film.

DESCRIPTION OF EMBODIMENTS

Hereinbelow, an exemplary embodiment of the present invention will be described in detail with reference to the accompanying drawings. It should be understood that the embodiment of the present invention may be changed to a variety of embodiments and the scope and spirit of the present invention are not limited to the embodiment described hereinbelow.

FIG. 1 is a perspective view showing a cathode and an anode according to the present invention and FIG. 2 is a plan view showing a resistance measurement member and a controller coupled each other in a cathode according to the present invention.

Referring to FIGS. 1 and 2, a battery cell 10 according to the present invention is configured to have a structure including a cathode 100, an anode 200, and a separator 300 interposed between the cathode 100 and the anode 200. An electrode mixture including respective electrode active materials 120, 220 is applied to one surface or both surfaces of each electrode current collector 110, 210 of the electrodes 100, 200.

Each electrode 100, 200 is provided with first electrode terminals 130, 230 respectively serving as an external input/output terminal of the battery cell 10. At least one of the electrodes 100, 200 is provided with a resistance measurement terminal 150, 250 at a position opposite to the first electrode terminal 130, 230 to measure a resistance of the electrode current collector 110, 210.

In detail, the cathode 100 may be provided with a resistance measurement cathode terminal 150 and the anode 200 may be provided with a resistance measurement anode terminal 250.

In one exemplary embodiment, the battery cell according to the present invention may include that one external input/output terminal selected from the first cathode terminal 130 and the first anode terminal 230, the resistance measurement terminal 150, 250 having same polarity with the selected external input/output terminal, and a resistance measurement member 20 are electrically connected to each other by a connection member 40 to measure a resistance of the electrode current collector 110, 210.

The resistance value of the electrode current collector 110, 210 measured by the resistance measurement member 20 is input to the controller 30, and the controller 30 applies the input resistance value to the resistance curve graph according to the temperature to estimate the current temperature of the electrode current collectors 110, 210.

FIG. 3 is a perspective view showing that the cathode, the separator, and the anode are stacked in order, and the electrode terminal and the electrode resistance measurement terminal are coupled to the cathode and the anode, according to the present invention; FIG. 4 is an enlarged view showing the connection between the cathode terminal and the cathode terminal for resistance measurement; FIG. 5 is an enlarged view showing the anode terminal and the anode terminal for resistance measurement; and FIG. 6 is a perspective view showing a structure in which a cathode sheet and an anode sheet are wound with the separator interposed therebetween according to the present invention.

Referring to FIGS. 3 to 6, in one exemplary embodiment, an electrode assembly according to the present invention may be configured as a structure in which a cathode sheet 100 and a anode sheet 200 are wound with a separator 300 interposed therebetween. Here, one end of the cathode sheet 100 may be provided with a first uncoated cathode portion 160 that is not coated with the electrode mixture, and one end of the anode sheet 200 may be provided with a first uncoated anode portion 260 that is not coated with the electrode mixture.

The battery cell 10 according to the present invention may include that a first cathode terminal 130 is coupled to a cathode current collector 110 of the first uncoated cathode portion 160, and a first anode terminal 230 is coupled to an anode current collector 210 of the first uncoated anode portion 260.

In one exemplary embodiment, other end of the cathode sheet 100 may be provided with a second uncoated cathode portion 170 that is not coated with the electrode mixture at a position opposite to the first uncoated cathode portion 160 and the resistance measurement cathode terminal 150 may be coupled to the cathode current collector 110 of the second uncoated cathode portion 170. Or, other end of the anode sheet 200 may be provided with a second uncoated anode portion 270 that is not coated with the electrode mixture at a position opposite to the first uncoated anode portion 260 and the resistance measurement anode terminal 250 may be coupled to the anode current collector 210 of the second uncoated anode portion 270.

Therefore, in case of the jelly-roll type electrode assembly, the first anode terminal 230 and the resistance measurement anode terminal 250 provided on the anode sheet 200 are electrically connected to each other by the connection member 40 such that the resistance measurement member 20 measures resistance values of the electrode current collectors 110, 210, the measured resistance values are input to the controller 30 to estimate temperatures of the electrode current collectors 110, 210 in real time.

FIG. 7 is a perspective view showing a structure in which a cathode plate and an anode plate are stacked with a separator interposed therebetween, and FIG. 8 is a perspective view showing a structure in which a cathode plate and an anode plate are stacked with a separator interposed therebetween and a resistance measurement member and a controller are connected.

Referring to FIGS. 7 and 8, in one exemplary embodiment, the battery cell according to the present invention may be configured as a structure in which the cathode plate 100 including the cathode current collector 110 coated with a cathode mixture including a cathode active material 120 on both surface thereof and the anode plate 200 including the anode current collector 210 coated with an anode mixture including an anode active material 220 on both surface thereof are stacked with the separator 300 interposed therebetween. An electrode tab 180, 280 not coated with the electrode mixture may protrude from each one end of the electrode plate 100, 200 and the electrode tab 180, 280 is coupled to an electrode lead (not shown) to form the first electrode terminal 130, 230.

In this case, the electrode plate 100, 200 is provided with a resistance measurement electrode tab 190, 290 protruding from a position opposite to the electrode tab 180, 280. The electrode tab 180, 280, the resistance measurement electrode tab 190, 290, and the resistance measurement member 20 are electrically connected by the connection member 40, and the controller 30 which estimates a temperature of the battery cell by inputting a resistance value is further included therein.

In one exemplary embodiment, such a stack-type electrode assembly provides that a cathode tab 180 may protrude from one end of the cathode plate 100, and be connected with a cathode lead (not shown) to form the first cathode terminal 130. In addition, the cathode tab 180 and a resistance measurement cathode tab 190 disposed at a position opposite to the cathode tab 180 are electrically connected to each other by the connection member 40 such that a resistance value of the cathode current collector 110 is measured by the resistance measurement member 20 and a measured resistance value is input to the controller 30 to estimate a temperature of the cathode current collector 110 in real time.

FIG. 9 is a perspective view showing that a resistance between resistance measurement cathode tabs is measured by an additional resistance measurement cathode tab.

Referring to FIG. 9, in one exemplary embodiment, a battery cell 10 according to the present invention includes a pair of electrode tabs 180, 280, a pair of resistance measurement cathode tabs 190, 190, and a pair of resistance measurement anode tabs 290, 290. In addition, the pair of resistance measurement cathode tabs 190, 190 is electrically connected to each other by the connection member 40 and the controller 30 estimating a temperature of the battery cell by inputting a resistance value is further included therein. Therefore, it is not necessary to use the existing electrode tabs 180, 280 to measure an inner temperature of the battery cell 10 according to the present invention and the resistance of the electrode current collector 110, 210 may be measured by adding the resistance measurement electrode tab 190, 290.

FIG. 10 is a perspective view showing a structure in which a plurality of cathode plates and a plurality of anode plates are stacked with the separator interposed between the cathode plate and the anode plate, and the resistance measurement member and the controller are connected to each other. FIG. 11 is an enlarged cross-sectional view showing a part of FIG. 9.

Referring to FIGS. 10 and 11 with reference to FIG. 7, in one exemplary embodiment, a battery cell 10 according to the present invention is configured as a structure stacked with a plurality of the structures in which the cathode plate 100 and the anode plate 200 are stacked with the separator 300 interposed therebetween as shown in FIG. 7. In detail, the stack-type structure is formed by stacking the cathode plate 100 including the cathode current collector 110 coated with the cathode mixture including the cathode active material 120 on both surfaces thereof, the separator 300, the anode plate 200 including the anode current collector 210 coated with the anode mixture including the anode active material 220, and the separator 300 in consecutive order.

FIG. 12 is a plan view showing that at least one cathode plate and at least one anode plate are arranged with the separator interposed between the cathode plate and the anode plate; and FIG. 13 is a front view showing a structure configured with a plurality of unit cells having the structure in which at least one cathode plate and at least one anode plate are stacked with the separator interposed therebetween are wound with a separation film.

Referring to FIGS. 12 and 13, in one exemplary embodiment, a battery cell 10 according to the present invention may be configured as a structure in which a plurality of unit cells having the structure in which at least one cathode plate 100 and at least one anode plate 200 are stacked with the separator 300 interposed therebetween are wound with the separation film 50.

Here, in the unit cells, the electrode tab 180, 280 may protrude from some of the electrode plates 100, 200 and each electrode tab 180, 280 may be coupled to the electrode lead (not shown) to form the electrode terminal 130, 230. In addition, in the unit cells, the resistance measurement electrode tab 190, 290 may be provided at a position opposite to the electrode tabs 180, 280 on the electrode plate 100, 200 of the electrode plates.

In one exemplary embodiment, such a stack/folding-type electrode assembly includes that the cathode tab 180 may protrude from one end of the cathode plate 100 and connected with the cathode lead (not shown) to form the first cathode terminal 130. In addition, the cathode tab 180 and the resistance measurement cathode tab 190 disposed at a position opposite to the cathode tab 180 are electrically connected to each other by the connection member 40 such that a resistance of the cathode current collector 110 is measured by the resistance measurement member 20, and a measured resistance value is input to the controller 30 to estimate a temperature of the cathode current collector 110 in real time.

In addition, in one exemplary embodiment, a battery cell according to the present invention may be configured as a structure in which A-type bi-cells 60 provided with the cathode plate 100 at an outermost side thereof and C-type bi-cells provided with the anode plate 200 at an outermost side thereof are wound with the separation film 50, as shown in FIG. 13.

Although a preferred embodiment of the present invention has been described for illustrative purposes, those skilled in the art will appreciate that various modifications, additions and substitutions are possible, without departing from the scope and spirit of the invention as disclosed in the accompanying claims.

INDUSTRIAL APPLICABILITY

As described above, in a battery cell according to the present invention, at least one of a cathode and an anode is provided with a resistance measurement terminal at a position opposite to the external input/output terminal for measuring a resistance of an electrode current collector to measure a electrode current collector temperature of the battery cell in real time, so a proactive protection device is capable of being operated. In addition, it is possible to detect an inner temperature of the battery cell more accurately, thereby improving the safety. Furthermore, the battery cell according to the present invention provides excellent manufacturing processability and economic efficiency, and can be applied to various types of electrode assemblies.

What is claimed is:

1. A battery cell comprising an electrode assembly having a cathode, an anode, and a separator interposed between the cathode and the anode,
   wherein an electrode mixture including an electrode active material is applied to one surface or both surfaces of each electrode current collector of the cathode and the anode,
   the cathode and the anode are provided with a first cathode terminal and a first anode terminal respectively serving as external input/output terminals, and at least one of the first cathode terminal and the first anode terminal is electrically connected to a resistance measurement terminal at a position opposite to the external input/output terminal, the resistance measurement terminal being configured to measure a resistance of the electrode current collector, and
   wherein either the first cathode terminal and the resistance measurement terminal both extend from the cathode, or the first anode terminal and the resistance measurement terminal both extend from the anode.

2. The battery cell of claim 1, further comprising: a resistance measurement member measuring the resistance of the electrode current collector and a controller estimating a temperature of the battery cell,
   wherein the cathode is provided with a resistance measurement cathode terminal, and the anode is provided with a resistance measurement anode terminal.

3. The battery cell of claim 1, wherein the electrode assembly is configured as a structure in which a cathode sheet and an anode sheet are wound with the separator interposed therebetween,
   one end of the cathode sheet is provided with a first uncoated cathode portion that is not coated with the electrode mixture and one end of the anode sheet is provided with a first uncoated anode portion that is not coated with the electrode mixture, and
   the first cathode terminal is coupled to the electrode current collector of the first uncoated cathode portion and the first anode terminal is coupled to the electrode current collector of the first uncoated anode portion.

4. The battery cell of claim 3, wherein the cathode sheet is provided at an end thereof opposite to the first uncoated cathode portion with a second uncoated cathode portion that is not coated with the electrode mixture and a resistance measurement cathode terminal is coupled to the electrode current collector of the second uncoated cathode portion.

5. The battery cell of claim 3, wherein the anode sheet is provided at an end thereof opposite to the first uncoated anode portion with a second uncoated anode portion that is not coated with the electrode mixture and the resistance measurement anode terminal is coupled to the electrode current collector of the second uncoated anode portion.

6. The battery cell of claim 1, wherein the electrode assembly is configured as a structure in which a plurality of cathode plates and a plurality of anode plates are stacked with the separators interposed therebetween,
   a cathode tab that is not coated with the electrode mixture protrudes from each one end of the cathode plates and an anode tab that is not coated with the electrode mixture protrudes from each one end of the anode plates, and
   the cathode tab is coupled to a cathode lead to form the first cathode terminal and the anode tab is coupled to an anode lead to form the first anode terminal.

7. The battery cell of claim 6, wherein one of the plurality of cathode plates is provided with a resistance measurement cathode tab protruding from a position opposite to the cathode tabs.

8. The battery cell of claim 6, wherein one of the plurality of anode plates is provided with a resistance measurement anode tab protruding from a position opposite to the anode tabs.

9. The battery cell of claim 1, wherein the electrode assembly is configured as a structure in which a plurality of unit cells having a structure in which at least one cathode plate and at least one anode plate are stacked with the separator interposed therebetween are wound with a separation film,
   a cathode tab that is not coated with the electrode mixture protrudes from each one end of the cathode plate of the unit cells and an anode tab that is not coated with the electrode mixture protrudes from each one end of the anode plate of the unit cells, and
   each cathode tab of the wound unit cells is coupled to a cathode lead to form the first cathode terminal and each anode tab is coupled to an anode lead to form the first anode terminal.

10. The battery cell of claim 9, wherein one of the cathode plates of the wound unit cells is provided with a resistance measurement cathode tab protruding from a position opposite to the cathode tabs.

11. The battery cell of claim 9, wherein one of the anode plates of the wound unit cells is provided with a resistance measurement anode tab protruding from a position opposite to the anode tabs.

12. The battery cell of claim 2, wherein the controller estimates a temperature of the electrode current collector by a measured resistance value thereof based on a temperature correlation according to a resistance of metal of the electrode current collector.

13. The battery cell of claim 1, wherein an additional resistance measurement terminal is provided in an electrode surface perpendicularly neighboring to the resistance measurement terminal and the resistance measurement terminals are electrically connected to each other by a connection member to measure the resistance of the electrode current collector.

14. A battery pack comprising a battery cell having an electrode assembly having a cathode, an anode, and a separator interposed between the cathode and the anode, and a controller estimating a temperature of the battery cell,
   wherein an electrode mixture including an electrode active material is applied to one surface or both surfaces of each electrode current collector of the cathode and the anode,
   the cathode and the anode are provided with a first cathode terminal and a first anode terminal respectively serving as external input/output terminals, and at least one of the first cathode terminal and the first anode terminal is electrically connected to a resistance measurement terminal at a position opposite to the external input/output terminal, the resistance measurement terminal being configured to measure a resistance of the electrode current collector, wherein the battery cell further comprises a resistance measurement member configured to measure the resistance between either: the first cathode terminal and the resistance measurement terminal that both extend from the cathode; or the first anode terminal and the resistance measurement terminal that both extend from the anode, and wherein the controller further includes a function electrically disconnecting the external input/output terminal of the battery cell when a measured temperature obtained from the resistance measurement member and the controller is equal to or greater than a critical value.

\* \* \* \* \*